United States Patent
Baek et al.

(10) Patent No.: US 11,647,662 B2
(45) Date of Patent: May 9, 2023

(54) DISPLAY APPARATUS COMPRISING ABSORPTIVE SCATTERING ELEMENT

(71) Applicant: Samsung Display Co., Ltd., Yongin-si (KR)

(72) Inventors: Moonjung Baek, Seoul (KR); Hyunwoo Noh, Yongin-si (KR); Keunyoung Park, Suwon-si (KR); Haeil Park, Seoul (KR); Kwangkeun Lee, Osan-si (KR); Junhan Lee, Seoul (KR); Suji Han, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 311 days.

(21) Appl. No.: 17/160,352

(22) Filed: Jan. 27, 2021

(65) Prior Publication Data

US 2021/0335893 A1 Oct. 28, 2021

(30) Foreign Application Priority Data

Apr. 23, 2020 (KR) .................. 10-2020-0049438

(51) Int. Cl.
*H10K 59/38* (2023.01)
*H10K 50/854* (2023.01)
*H10K 50/86* (2023.01)
*H10K 59/12* (2023.01)
*H01L 27/32* (2006.01)
*H01L 51/52* (2006.01)

(52) U.S. Cl.
CPC ........ *H01L 27/322* (2013.01); *H01L 27/3244* (2013.01); *H01L 51/5268* (2013.01); *H01L 51/5284* (2013.01)

(58) Field of Classification Search
None
See application file for complete search history.

(56) References Cited

U.S. PATENT DOCUMENTS

| 2015/0285969 A1* | 10/2015 | Kim ..................... G02B 5/201 359/891 |
| 2016/0195774 A1* | 7/2016 | Lee ................... G02F 1/133617 349/110 |
| 2018/0156951 A1 | 6/2018 | Baek et al. |
| 2019/0006460 A1 | 2/2019 | Jang et al. |

(Continued)

FOREIGN PATENT DOCUMENTS

| KR | 10-2016-0084794 | 7/2016 |
| KR | 10-2017-0039064 | 4/2017 |

(Continued)

*Primary Examiner* — Nduka E Ojeh
(74) *Attorney, Agent, or Firm* — H.C. Park & Associates, PLC

(57) ABSTRACT

A display apparatus including a light emitting device layer emitting a first light having a peak wavelength of 500 nm or less, a color control layer disposed on the light emitting device layer, the color control layer including an emitting element converting the first light, a color filter layer disposed on the color control layer, and an absorptive scattering element provided in or on the color control layer. The absorptive scattering element may include a light absorbing portion, in which absorptivity of a green or red light is greater than absorptivity of the first light. Accordingly, reflectance of the display apparatus to an external light may be reduced.

20 Claims, 12 Drawing Sheets

(56) References Cited

U.S. PATENT DOCUMENTS

2019/0227431 A1    7/2019  Park et al.
2019/0235320 A1*   8/2019  Lin ...................... H01L 27/322

FOREIGN PATENT DOCUMENTS

| KR | 10-2018-0064616 | 6/2018 |
| KR | 10-2019-0021516 | 3/2019 |
| KR | 10-2019-0090114 | 8/2019 |
| KR | 10-2019-0111177 | 10/2019 |

* cited by examiner

DISPLAY APPARATUS COMPRISING ABSORPTIVE SCATTERING ELEMENT

CROSS-REFERENCE TO RELATED APPLICATIONS

This application claims priority from and the benefit of Korean Patent Application No. 10-2020-0049438, filed on Apr. 23, 2020, which is hereby incorporated by reference for all purposes as if fully set forth herein.

BACKGROUND

Field

The present invention relates to a display apparatus, and in particular, to a display apparatus configured to reduce reflectance of an external light.

Discussion of the Background

Various display apparatuses are being developed for use in multimedia devices, such as televisions, mobile phones, tablet computers, and the like. In order to produce a color image, a display panel, which is included in the display apparatus includes different kinds of color control layers according to pixels. The color control layer transmits a source light of a specific wavelength range or changes a color of a source light.

A part of the source light passing though the color control layer is not converted by a color converting material and is absorbed by a color filter. That is, the display apparatus suffers from an optical loss issue. Accordingly, it is necessary to develop a structure capable of improving light-emitting efficiency.

The above information disclosed in this Background section is only for understanding of the background of the inventive concepts, and, therefore, it may contain information that does not constitute prior art.

SUMMARY

An exemplary embodiment of the inventive concept provides a display apparatus including a color control member, in which an absorptive scattering element having high optical absorptivity in a specific wavelength range is added, and thereby reducing reflectance of an external light.

Additional features of the inventive concepts will be set forth in the description which follows, and in part will be apparent from the description, or may be learned by practice of the inventive concepts.

An exemplary embodiment of the inventive concept provides a display apparatus including a light emitting device layer emitting a first light having a peak wavelength of 500 nm or less, a color control layer disposed on the light emitting device layer, the color control layer including an emitting element emitting the first light, a color filter layer disposed on the color control layer, and an absorptive scattering element provided in or on the color control layer. The absorptive scattering element includes a light absorbing portion, in which absorptivity to a green or red light is greater than absorptivity to the first light.

The light absorbing portion may have a mean transmittance of 70% or higher for light having a peak wavelength from 440 nm to 500 nm and may have a mean transmittance of 10% or lower for light having a peak wavelength from 520 nm to 780 nm.

The emitting element may be a quantum dot or a fluorescent body.

The color control layer may include a color control unit including the emitting element and the absorptive scattering element, and a weight ratio of the absorptive scattering element may range from 1 wt % to 10 wt %, relative to a total weight of the color control unit.

The absorptive scattering element may include a center portion with a scattering body, and the light absorbing portion may be disposed on a surface of the center portion.

The color control layer may include a first color control unit including a first emitting element configured to convert the first light to a second light, which has a different peak wavelength from that of the first light, and a second color control unit including a second emitting element configured to convert the first light to a third light, which has a different peak wavelength from that of the first light. The absorptive scattering element may be provided in at least one of the first and second color control units.

One of the first and second color control units may include the absorptive scattering element, and the other may include a dispersive scattering element including at least one of $TiO_2$, $ZrO_3$, $Al_2O_3$, MgO, $In_2O_3$, ZnO, $SnO_2$, $Sb_2O_3$, $SiO_2$, or ITO.

The color control layer may further include a third color control unit configured to transmit the first light, and the third color control unit may include a dispersive scattering element including at least one of $TiO_2$, $ZrO_3$, $Al_2O_3$, MgO, $In_2O_3$, ZnO, $SnO_2$, $Sb_2O_3$, $SiO_2$, or ITO.

One of the first and second color control units may include the absorptive scattering element, and the other may include the dispersive scattering element.

The display apparatus may further include a scattering layer disposed on the color control layer. The scattering layer may include the absorptive scattering element.

The scattering layer may be disposed between the color control layer and the color filter layer.

The color control layer may include a first color control unit including a first emitting element converting the first light to a second light, which has a different peak wavelength from that of the first light, a second color control unit including a second emitting element converting the first light to a third light, which has a different peak wavelength from that of the first light, and a third color control unit transmitting the first light.

The third color control unit may further include the absorptive scattering element.

The color filter layer may include a first color filter disposed on the first color control unit and configured to transmit the second light, a second color filter disposed on the second color control unit and configured to transmit the third light, and a protecting portion disposed on the third color control unit and configured to transmit the first to third lights.

Another exemplary embodiment of the inventive concept provides a display apparatus including a light emitting device layer emitting a blue light, a color control layer disposed on the light emitting device layer, the color control layer including an emitting element configured to convert the blue light to a visible light, which has a wavelength longer than the blue light, a color filter layer disposed on the color control layer, and an absorptive scattering element provided in the color control layer or between the color control layer and the color filter layer. The absorptive scattering element includes a scattering body and a light absorbing portion, which includes blue pigment or blue dye disposed on a surface of the scattering body.

The light absorbing portion may have a mean transmittance of 70% or higher for light having a peak wavelength from 440 nm to 500 nm and may have a mean transmittance of 10% or lower for light having a peak wavelength from 520 nm to 780 nm.

The light absorbing portion may include at least one of phthalocyanine blue ($C_{32}H_{16}CuN_8$) or cobalt blue ($CoAl_2O_4$).

The color control layer may include a first color control unit including a first emitting element configured to convert the blue light to a green light, a second color control unit including a second emitting element configured to convert the blue light to a red light, and a third color control unit including a dispersive scattering element. The color filter layer may include a green color filter disposed on the first color control unit and a red color filter disposed on the second color control unit.

The first or second color control unit may include the absorptive scattering element, and a weight ratio of the absorptive scattering element may range from 1 wt % to 10 wt %, relative to a total weight of the first or second color control unit with the absorptive scattering element.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

Figure 1:
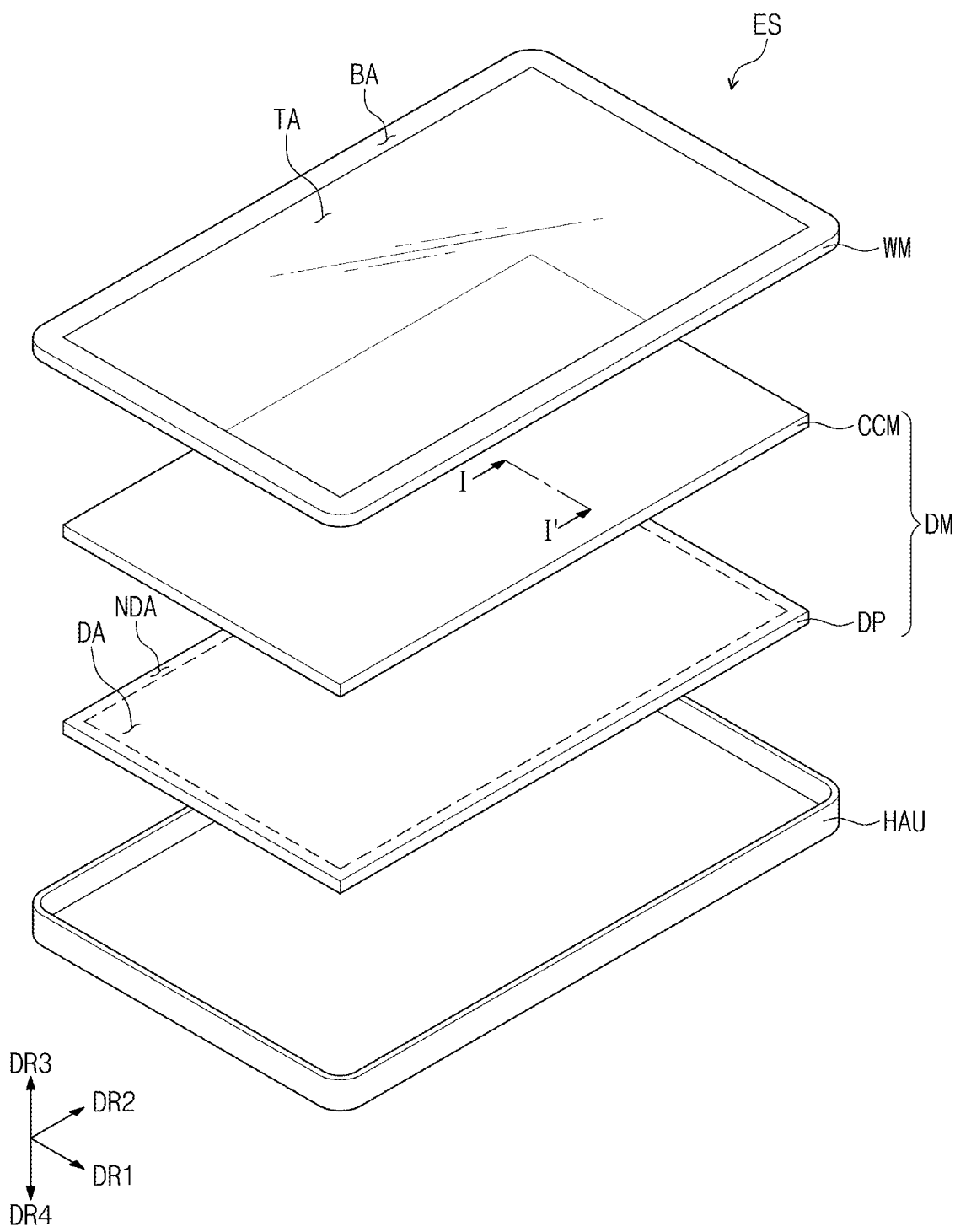
FIG. 1 is an exploded perspective view illustrating an electronic device according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

First, second, third, and fourth direction axes DR1, DR2, DR3, and DR4 are illustrated in the drawings including FIG. 1, and in the present specification, directions indicated by the first to fourth direction axes DR1 to DR4 are defined in a relative manner and may be used to indicate other directions.

In the present specification, a direction of the third direction axis DR3 is defined as a direction of an image to be provided toward a user, for convenience in illustration. Furthermore, as shown in FIG. 1, a display surface, to which an image is provided, may be a surface defined by the first direction axis DR1 and the second direction axis DR2.

FIG. 1 is an exploded perspective view illustrating an electronic device according to an embodiment of the inventive concept. An electronic device ES may be one of television sets, personal computers, laptop computers, personal digital assistants, car navigation systems, game machines, smart phones, and cameras, and that other electronic devices may be used to realize the inventive concept, unless they do not depart from the inventive concept.

Referring to FIG. 1, the electronic device ES may include a window WM, a display apparatus DM, and a housing HAU. The display apparatus DM may include a display panel DP and a color control member CCM.

If a surface of the display panel DP is defined as a display surface, the display panel DP may include a display region DA, on which an image is displayed, and a non-display region NDA, on which an image is not displayed.

The window WM may include a transmission region TA, which allows for transmission of an image provided from the display apparatus DM, and a light-blocking region BA, which does not allow the transmission of the image. The window WM may be disposed on the display apparatus DM to protect the display apparatus DM.

The housing HAU may be disposed below the display apparatus DM and may be used to contain the display apparatus DM. The housing HAU may be disposed to expose a top surface of the display apparatus DM while covering other surfaces.

The display panel DP may be a light-emitting type display panel. For example, the display panel DP may be a light-emitting diode (LED) display panel, an organic electroluminescence display panel, or a quantum dot (QD) light-emitting display panel. However, the inventive concept is not limited to these examples.

Hereinafter, an organic electroluminescence display panel will be discussed as an example of the display panel DP included in the display apparatus DM, but the inventive concept is not limited to this example.

Figure 2:
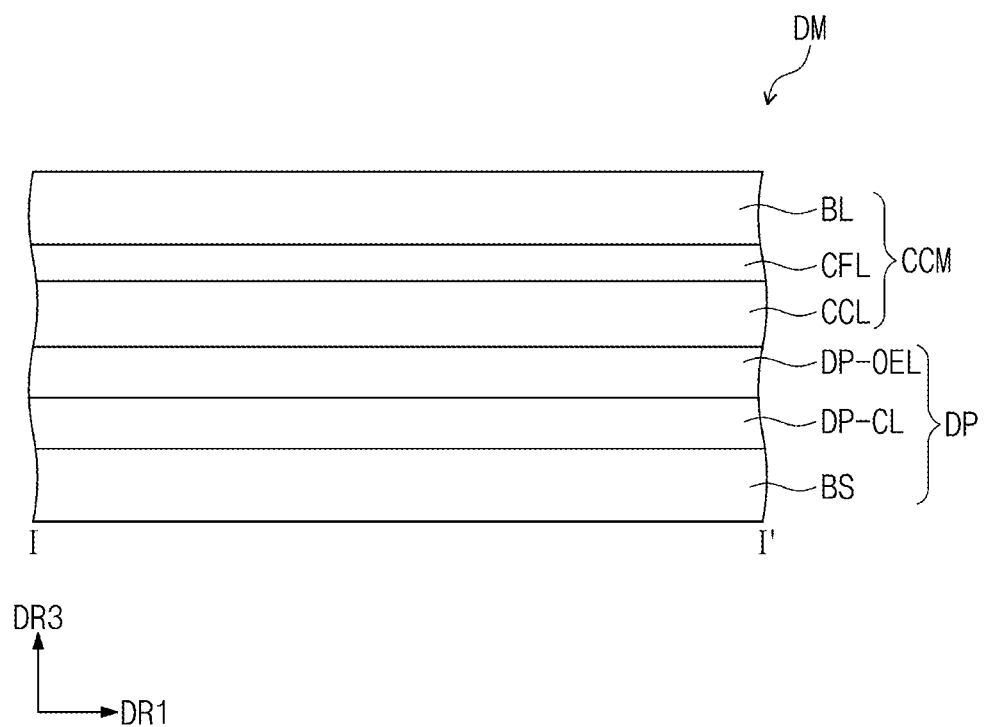
FIG. 2 is a sectional view, which is taken along a line I-I' of FIG. 1 to illustrate a display apparatus according to an embodiment of the inventive concept.

FIG. 2 is a sectional view, which is taken along I-I' of FIG. 1 to illustrate a display apparatus according to an embodiment of the inventive concept. Referring to FIG. 2, the display apparatus DM may include the display panel DP and the color control member CCM disposed on the display panel DP.

The display panel DP may include a base substrate BS, a circuit layer DP-CL, and a light emitting device layer DP-OEL, which are provided on the base substrate BS, and the base substrate BS, the circuit layer DP-CL, and the light emitting device layer DP-OEL may be sequentially stacked in the third direction axis DR3. In an embodiment, the circuit layer DP-CL may include a plurality of transistors (not shown), which are used to operate an organic electroluminescence device OEL of the light emitting device layer DP-OEL.

The color control member CCM may include a color control layer CCL, a color filter layer CFL, and a base layer BL. Unlike the illustrated embodiment, the base layer BL of the color control member CCM may be omitted.

The base layer BL may be an inorganic layer, an organic layer, or a layer made of a composite material. For example, the base layer BL may be a glass substrate, a metal substrate, a plastic substrate, or the like. However, the inventive concept is not limited to this example of the base layer BL.

Figure 3:
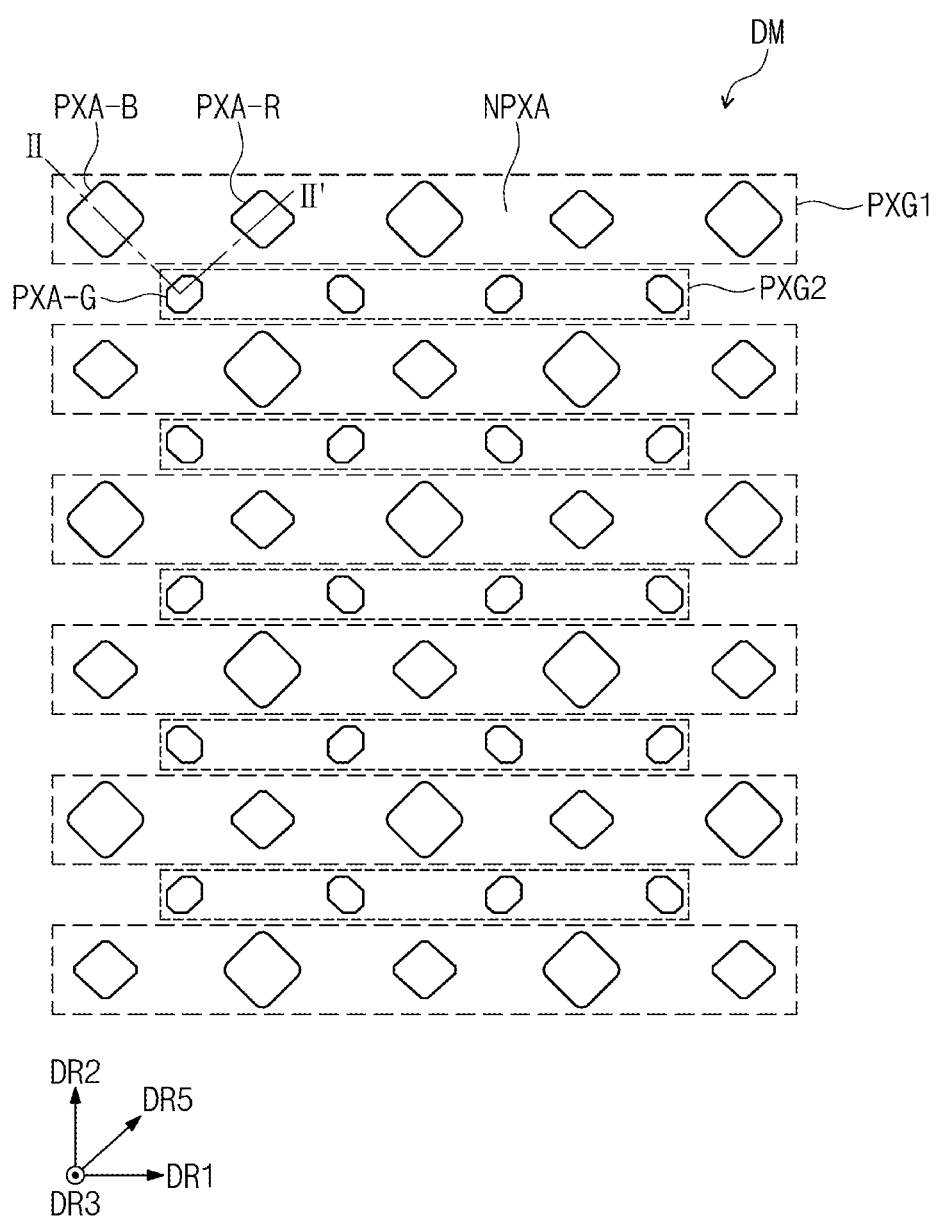
FIG. 3 is a plan view illustrating a display apparatus according to an embodiment of the inventive concept.

FIG. 3 is a plan view illustrating a portion of a display apparatus according to an embodiment of the inventive concept. The display apparatus DM may include a non-light-emitting region NPXA and light-emitting regions PXA-B, PXA-G, and PXA-R. Each of FIGS. 3, 4, 7 to 10, and 12 exemplarily illustrates three light-emitting regions PXA-B, PXA-G, and PXA-R, which are configured to emit lights of respective different colors. Each of the light-emitting regions PXA-B, PXA-G, and PXA-R may correspond to a pixel.

The light-emitting regions PXA-B, PXA-G, and PXA-R may have different areas from each other or may have the same area, and in an embodiment, an area ratio of the light-emitting regions PXA-B, PXA-G, and PXA-R may be different from that shown in FIG. 3.

Referring to FIG. 3, the first light-emitting regions PXA-B and the third light-emitting regions PXA-R may be alternately arranged along the first direction axis DR1 to constitute a first group PXG1. The second light-emitting regions PXA-G may be arranged along the first direction axis DR1 to constitute a second group PXG2.

The first group PXG1 and the second group PXG2 may be disposed to be spaced apart from each other and may be alternately arranged along the second direction axis DR2. The arrangement structure of the light-emitting regions PXA-B, PXA-G, and PXA-R may have a pentile structure, as shown in FIG. 3. However, the arrangement structure of the light-emitting regions PXA-B, PXA-G, and PXA-R is not limited to that shown in FIG. 3.

Figure 4:
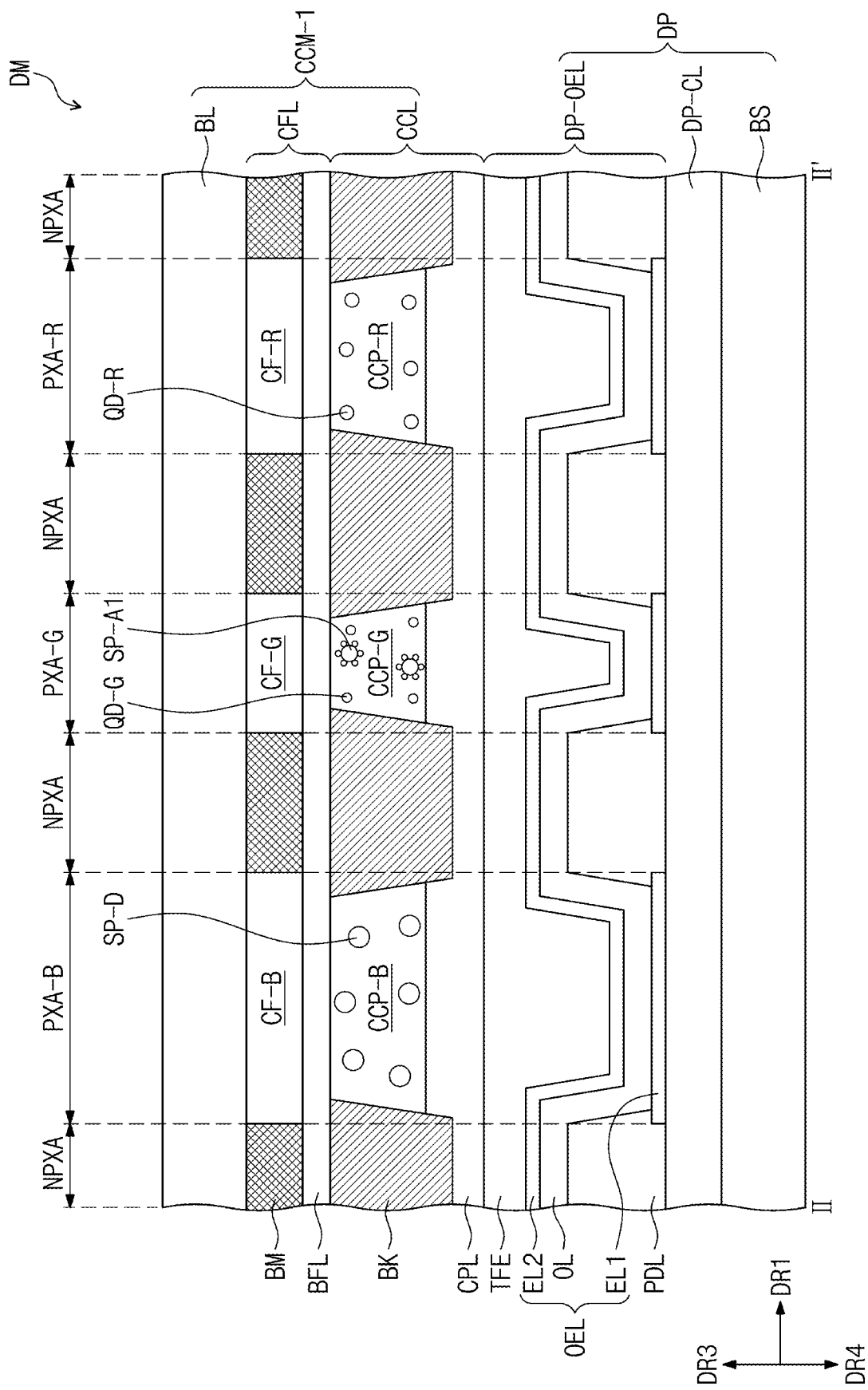
FIG. 4 is a sectional view, which is taken along a line II-II' of FIG. 3 to illustrate a display apparatus according to an embodiment of the inventive concept.
Figure 5:
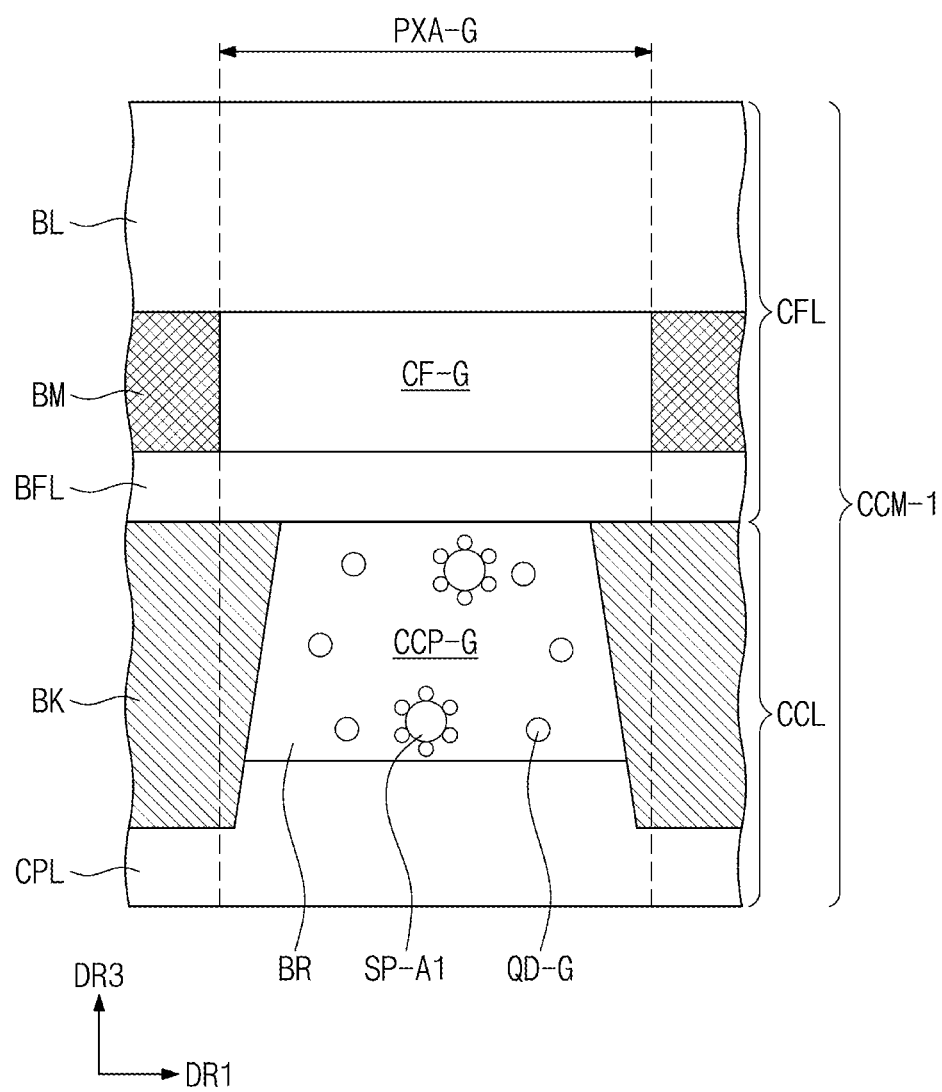
FIG. 5 is an enlarged sectional view illustrating a color control member according to an embodiment of the inventive concept.

FIG. 4 is a sectional view, which is taken along a line II-II' of FIG. 3 to illustrate color control member CCM-1 according to an embodiment of the inventive concept, and FIG. 5 is an enlarged sectional view illustrating a portion of a color control member CCM-1 of FIG. 4. In the following description of the display apparatus DM shown in FIG. 4, an element previously described with reference to FIGS. 1 to 3 will be identified by the same reference number without repeating a redundant description thereof.

The display apparatus according to an embodiment of the inventive concept may include an absorptive scattering element. Here, the absorptive scattering element may include a scattering body, which causes optical scattering, and a light absorbing portion, which has relatively high optical absorptivity to light in a specific wavelength range (i.e., which absorbs a part of the light in the specific wavelength region).

The display apparatus according to an embodiment of the inventive concept may include a dispersive scattering element. Here, the dispersive scattering element may include a material causing optical scattering or dispersing light incident thereto. Light, which is incident into a color control unit with the dispersive scattering element, may be scattered by the dispersive scattering element, and this may make it possible to increase optical conversion efficiency of the color control unit.

Referring to FIG. 4, the display apparatus DM may include the display panel DP, and the display panel DP may include the light emitting device layer DP-OEL. The light emitting device layer DP-OEL may emit light. Light emitted from the light emitting device layer DP-OEL may be a first light having a peak wavelength of 500 nm or less. For example, the first light may be ultraviolet (UV) or blue light.

FIGS. 4 and 5 illustrate an example of the display apparatus DM, in which the color control layer CCL with an absorptive scattering element SP-A1 is provided. The color control member CCM-1 disposed on the light emitting device layer DP-OEL may include the color filter layer CFL and the color control layer CCL. Referring to FIG. 4, the color control layer CCL may include a plurality of color control units CCP-B, CCP-G, and CCP-R and a partition portion BK, which is disposed between the plurality of color control units CCP-B, CCP-G, CCP-R spaced apart from each other.

The color control layer CCL may include a first color control unit CCP-G, a second color control unit CCP-R, and a third color control unit CCP-B. The first color control unit CCP-G may include a first emitting element QD-G, and the second color control unit CCP-R may include a second emitting element QD-R. The first emitting element QD-G may covert the first light, which is emitted from the light emitting device layer DP-OEL, to a second light having a peak wavelength different from that of the first light. The second emitting element QD-R may convert the first light, which is emitted from the light emitting device layer DP-OEL, to a third light having a peak wavelength different from that of the first light. The third color control unit CCP-B may be configured to transmit the first light, which is emitted from the light emitting device layer DP-OEL. The first light may have a peak wavelength of 500 nm or less, and the second light and the third light may have different peak wavelengths. For example, first light may be a blue light, the second light may be a green light, and the third light may be a red light.

The color control units CCP-B, CCP-G, and CCP-R may include the absorptive scattering element SP-A1, which has relatively high absorptivity to light in a specific wavelength range. FIG. 4 illustrates an example in which the absorptive scattering element SP-A1 is included in the first color control unit CCP-G. However, in an embodiment, the absorptive scattering element SP-A1 may be included in the second color control unit CCP-R, although not illustrated. In addition, the absorptive scattering element SP-A1 may be included in both of the first and second color control units CCP-G and CCP-R.

FIG. 5 is an enlarged sectional view illustrating a color control unit CCP-G, in which the absorptive scattering element SP-A1 is included. The color control unit CCP-G may include a base resin BR, the absorptive scattering element SP-A1, and an emitting element QD-G. The emitting element QD-G and the absorptive scattering element SP-A1 may be dispersed in the base resin BR.

The optical conversion efficiency and the reflectance of an external light may depend on a weight ratio of the absorptive scattering element SP-A1. As the weight ratio of the absorptive scattering element SP-A1 is increased, the reflectance of the external light may be decreased by the light absorbing portion of the absorptive scattering element SP-A1. However, if the weight ratio is increased above a specific value, the reduction of the optical conversion efficiency may be greater than the reduction in reflectance of the external light, and in this case, the total light-emitting efficiency of the display apparatus may be reduced.

In an embodiment, if a total weight of the color control unit CCP-G is given by a sum of weights of the base resin BR, the emitting element QD-G, and the absorptive scattering element SP-A1, the weight ratio of the absorptive scattering element SP-A1 may range from 1 wt % to 10 wt %, relative to the total weight of the color control unit CCP-G.

In the case where the first and second color control units CCP-G and CCP-R include absorptive scattering elements SP-A1 and SP-A2, respectively, a weight ratio of the absorptive scattering element SP-A1 in the first color control unit CCP-G may range from 1 wt % to 10 wt %, relative to the total weight of the first color control unit CCP-G, and a weight ratio of the absorptive scattering element SP-A2 in the second color control unit CCP-R may range from 1 wt % to 10 wt %, relative to the total weight of the second color control unit CCP-R. The absorptive scattering elements SP-A1 and SP-A2, which are respectively included in the first and second color control units CCP-G and CCP-R, may have the same weight ratio or different weight ratios.

Figure 6:
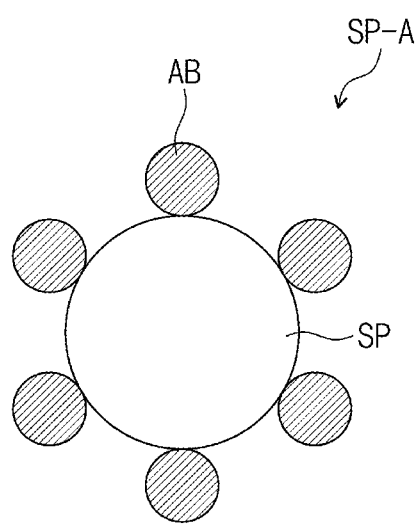
FIG. 6 is a sectional view illustrating an absorptive scattering element according to an embodiment of the inventive concept.

FIG. 6 is an enlarged sectional view illustrating an absorptive scattering element according to an embodiment of the inventive concept. An absorptive scattering element SP-A may include a scattering body SP disposed at a center thereof and at least one light absorbing portion AB disposed on a surface of the scattering body SP.

The scattering body SP may include a material causing an optical scattering. For example, the scattering body SP may be an inorganic particle. In an embodiment, the scattering body SP may be formed of or include at least one of $TiO_2$, $ZrO_3$, $Al_2O_3$, $MgO$, $In_2O_3$, $ZnO$, $SnO_2$, $Sb_2O_3$, $SiO_2$, or ITO.

Transmittance of the light absorbing portion AB according to a wavelength of an incident light may be changed depending on a kind or content of a material constituting the light absorbing portion AB. Transmittance of the light absorbing portion AB may be lower in light having a peak wavelength of 500 nm to 780 nm compared to light having a peak wavelength of 500 nm or less. That is, in the light absorbing portion AB, absorptance of the light, which has a peak wavelength of 500 nm to 780 nm, may be higher than that of the light, which has a peak wavelength of 500 nm or less.

In detail, a mean transmittance of the light absorbing portion AB may be equal to or less than 70% to light, which has a peak wavelength of 380 nm to 440 nm, may be equal to or greater than 70% to light, which has a peak wavelength of 440 nm to 500 nm, and may be equal to or less than 10% to light, which has a peak wavelength of 520 nm to 780 nm. The mean transmittance may mean a mean value of transmittance in a specific wavelength range and may correspond to an arithmetic mean value. In an embodiment, the mean transmittance of the light absorbing portion AB may range from 0% to 60% within a wavelength range from 380 nm to 440 nm, may range from 70% to 100% within a wavelength range from 440 nm to 500 nm, and may range from 0% to 10% within a wavelength range from 501 nm to 780 nm.

The light absorbing portion AB may be configured to have higher absorptance to a green or red light than to a blue light. The light absorbing portion AB may include blue pigment or blue dye. Blue pigment or blue dye may be bonded to the surface of the scattering body SP. For example, the light absorbing portion AB may be formed of or include at least one of phthalocyanine blue ($C_{32}H_{16}CuN_8$) or cobalt blue ($CoAl_2O_4$). However, the inventive concept is not limited to these example materials for the light absorbing portion AB.

The absorptive scattering element SP-A may absorb light in a specific wavelength range of an external light incident to a display apparatus DD in high absorptance, and this may make it possible to reduce the reflectance of the external light. For example, the absorptive scattering element SP-A may include the light absorbing portion AB, which absorbs light whose peak wavelength is within a wavelength range of 520 nm to 780 nm, in absorptance of 90% or higher, and this may make it possible to reduce the reflectance of the red or green light, which is incident into the display apparatus DD and is reflected by the scattering element SP-A.

Referring to FIG. 4, the color filter layer CFL may include a plurality of color filters CF-B, CF-G, and CF-R. A light-blocking portion BM may be provided in the color filter layer CFL to define or delimit a border between adjacent ones of the color filters CF-B, CF-G, and CF-R. The color filter layer CFL may further include a buffer layer BFL disposed below the plurality of color filters CF-B, CF-G, and CF-R, and the light-blocking portion BM.

The light-blocking portion BM may prevent a light leakage issue from occurring. The light-blocking portion BM may be a black matrix. The light-blocking portion BM may include an organic or inorganic light-blocking material, in which black pigment or black dye is contained. Meanwhile, the inventive concept is not limited to this example of the light-blocking portion BM, and the light-blocking portion BM may include blue pigment or dye and may be provided as a part of the third color (e.g., blue) filter CF-B.

The color filters CF-B, CF-G, and CF-R may be configured to transmit lights within different wavelength ranges. For example, a first color filter CF-G may transmit light which is converted from a first light to a second light by the first emitting element QD-G. A second color filter CF-R may transmit light which is converted from the first light to a third light by the second emitting element QD-R. A third color filter CF-B may transmit the first light emitted from the light emitting device layer DP-OEL. For example, the first color filter CF-G may transmit a green light, the second color filter CF-R may transmit a red light, and the third color filter CF-B may transmit a blue light.

Each of the color filters CF-B, CF-G, and CF-R may include a polymer photo-sensitive resin and a pigment or dye material. For example, the first color filter CF-G may be a green color filter including green pigment or dye, the second color filter CF-R may be a red color filter including red pigment or dye, and the third color filter CF-B may be a blue color filter including blue pigment or dye.

However, the inventive concept is not limited to this example, and the third color filter CF-B may not include any pigment or dye. The third color filter CF-B may include a polymer photo-sensitive resin but may not include pigment or dye. The third color filter CF-B may be transparent. The third color filter CF-B may be formed of a transparent photo-sensitive resin.

Referring to FIG. 4, the light emitting device layer DP-OEL may include a pixel definition layer PDL, an organic electroluminescence device OEL, and a thin encapsulation layer TFE. An opening part may be defined in the pixel definition layer PDL. The pixel definition layer PDL may overlap the non-light-emitting region NPXA and define or delimit the light emitting regions PXA-B, PXA-G, and PXA-R. The pixel definition layer PDL may be formed of or include a light absorption material.

The organic electroluminescence device OEL may include a first electrode EL1 and a second electrode EL2, which are opposite to each other, and an organic layer OL, which is disposed between the first electrode EL1 and the second electrode EL2. The opening part of the pixel definition layer PDL may expose at least a part of the first electrode EL1. The organic layer OL may include a hole transporting region, a light emitting layer, and an electron transporting region. The organic layer OL may generate light and emit light onto the light emitting device layer DP-OEL.

The thin encapsulation layer TFE may be disposed on the organic electroluminescence device OEL. The thin encapsulation layer TFE may seal the organic electroluminescence device OEL to protect the organic electroluminescence device OEL from penetration of moisture and/or oxygen.

The color control layer CCL may further include a capping layer CPL. The capping layer CPL may be disposed below the color control unit CCP and the partition portion BK and may prevent penetration of moisture and/or oxygen.

A color control member according to an embodiment of the inventive concept may include a color control layer, an absorptive scattering element, and a color filter layer. As an example, the color control member may include a color control layer including an absorptive scattering element and a color filter layer disposed on the color control layer. As another example, the color control member may include a color control layer and a color filter layer disposed on the color control layer, and a scattering layer including an absorptive scattering element may be disposed between the color control layer and the color filter layer.

Figure 7:
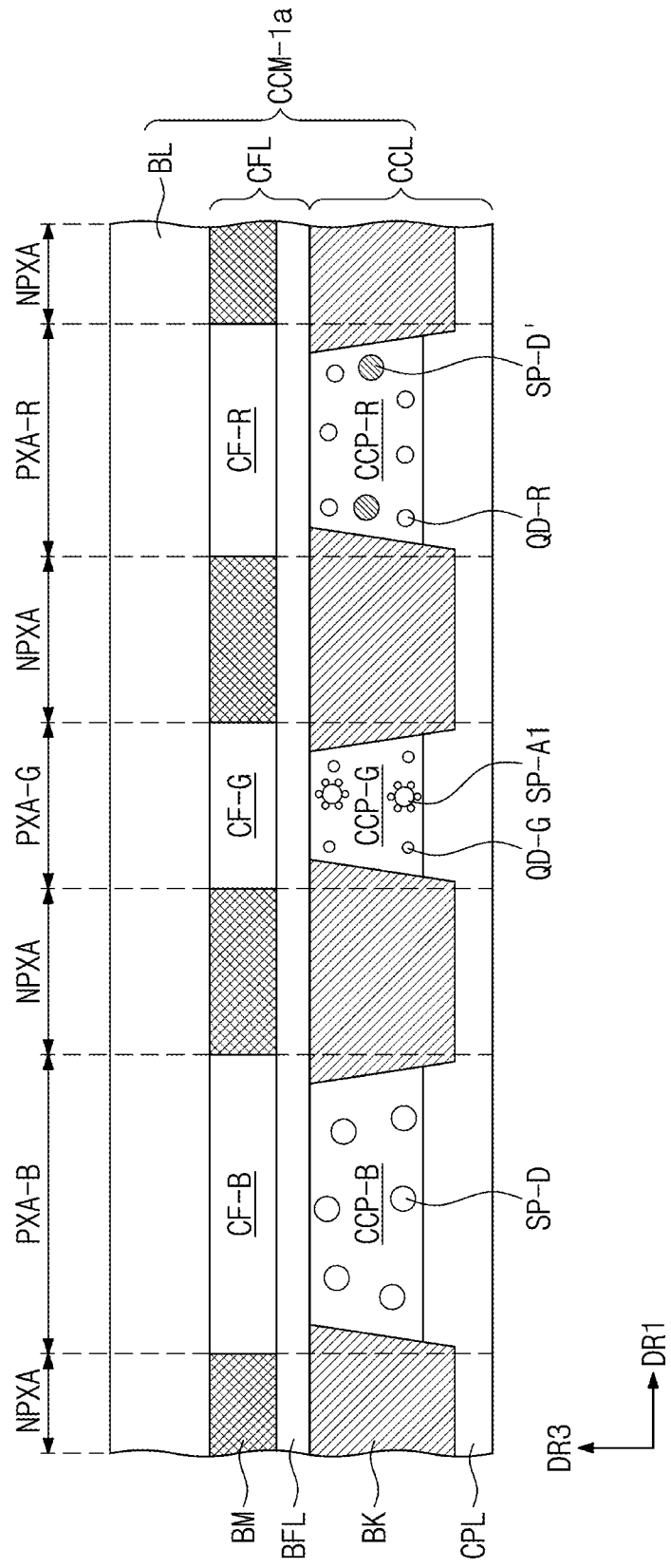
FIG. 7 is a sectional view illustrating a color control member according to an embodiment of the inventive concept.
Figure 8:
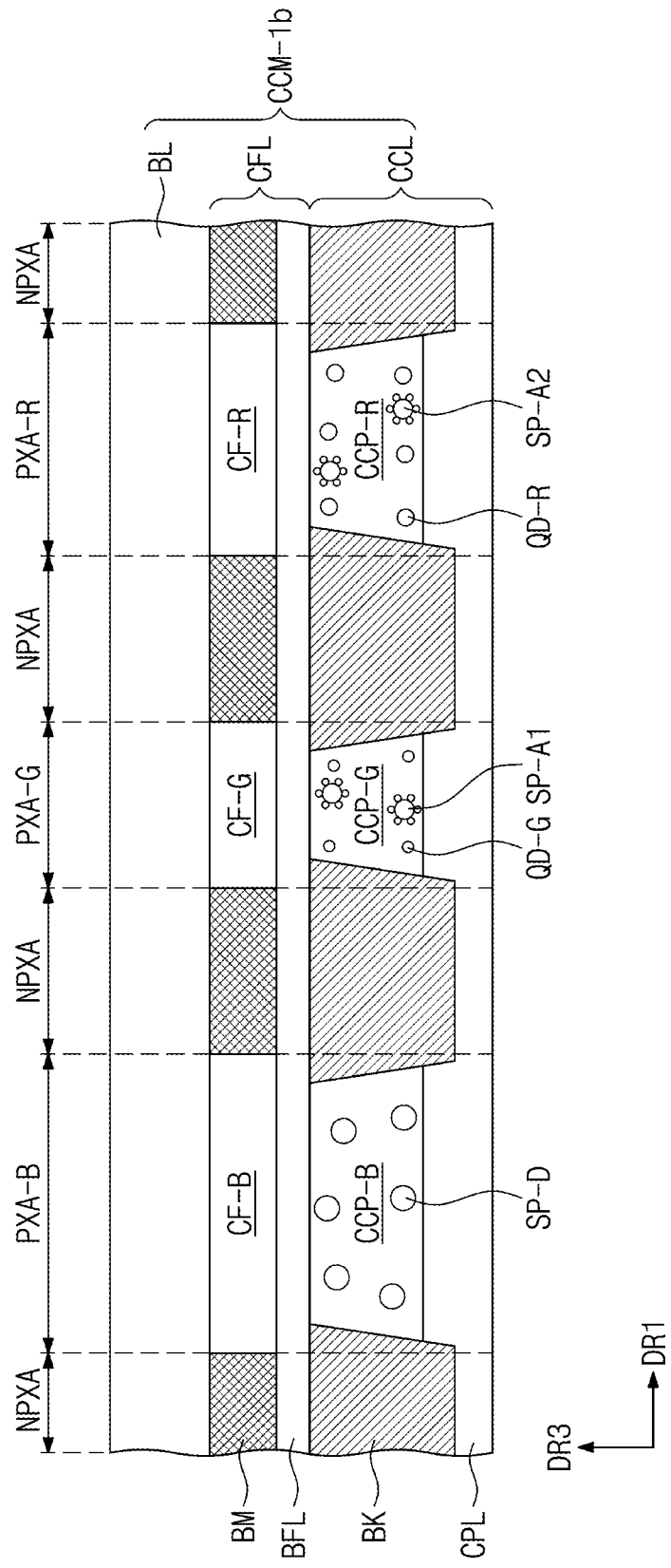
FIG. 8 is a sectional view illustrating a color control member according to an embodiment of the inventive concept.

FIGS. 7 and 8 are sectional views, each of which illustrates a color control member according to an embodiment of the inventive concept. In an embodiment of FIG. 7, a color control member CCM-1a may include the absorptive scattering element SP-A1 provided in the first color control unit CCP-G. In an embodiment of FIG. 8, a color control member CCM-1b may include the absorptive scattering elements SP-A1 and SP-A2, which are respectively provided in the first and second color control units CCP-G and CCP-R. In an embodiment, the absorptive scattering element may be included in at least one of the first and second color control units CCP-G and CCP-R. For example, although not shown, the absorptive scattering element may be included in only the second color control unit CCP-R.

The third color control unit CCP-B may include a dispersive scattering element SP-D causing optical scattering. The dispersive scattering element SP-D may scatter a first light, which is incident from the light emitting device layer DP-OEL into the third color control unit CCP-B. The first light may have a peak wavelength of 500 nm or less. For example, the first light may be a blue light.

The dispersive scattering element SP-D may be formed of or include at least one of $TiO_2$, $ZrO_3$, $Al_2O_3$, MgO, $In_2O_3$, ZnO, $SnO_2$, $Sb_2O_3$, $SiO_2$, or ITO. For example, the dispersive scattering element SP-D may be formed of, or include, the same material as the scattering body SP of the absorptive scattering element SP-A.

In the embodiment of FIG. 7, the second color control unit CCP-R, in which the absorptive scattering element SP-A1 is not included, may include the dispersive scattering element SP-D'. The dispersive scattering element SP-D' may be formed of or include the same material as the dispersive scattering element SP-D included in the third color control unit CCP-B or may be formed of or include other material causing the optical scattering. The absorptive scattering element may be provided in at least one of the first and second color control units CCP-G and CCP-R, and the dispersive scattering element may be provided in at least one of the color control units, in which the absorptive scattering element is not provided. The dispersive scattering element in the first color control unit CCP-G or the second color control unit CCP-R may scatter the first light, which is incident into the color control unit from the light emitting device layer DP-OEL. Since the first light is scattered, the first light may be more easily converted to the second or third light by the first emitting element QD-G or the second emitting element QD-R, and this may make it possible to reduce optical loss.

For the color control member CCM-1b shown in FIG. 8, the absorptive scattering elements SP-A1 and SP-A2 may be provided in the first and second color control units CCP-G and CCP-R, respectively. The absorptive scattering element SP-A1 in the first color control unit CCP-G and the absorptive scattering element SP-A2 in the second color control unit CCP-R may be formed of the same material or may have the same content. However, the inventive concept is not limited to this example, and in an embodiment, the absorptive scattering element SP-A1 in the first color control unit CCP-G may be different from the absorptive scattering element SP-A2 in the second color control unit CCP-R in terms of at least one of material and content.

The absorptive scattering elements SP-A1 and SP-A2 in the first and second color control units CCP-G and CCP-R may have high absorptance to a green or red light. The absorptive scattering element SP-A1 may absorb a green light, which passes through the first color filter CF-G disposed on the first color control unit CCP-G, and the absorptive scattering element SP-A2 may absorb a red light, which passes through the second color filter CF-R disposed on the second color control unit CCP-R. Accordingly, a large fraction of an external light, which is incident into the color control units CCP-G and CCP-R through the color filter layer CFL, may be absorbed by the absorptive scattering elements SP-A1 and SP-A2, and this may make it possible to reduce the reflectance of the external light.

Figure 9:
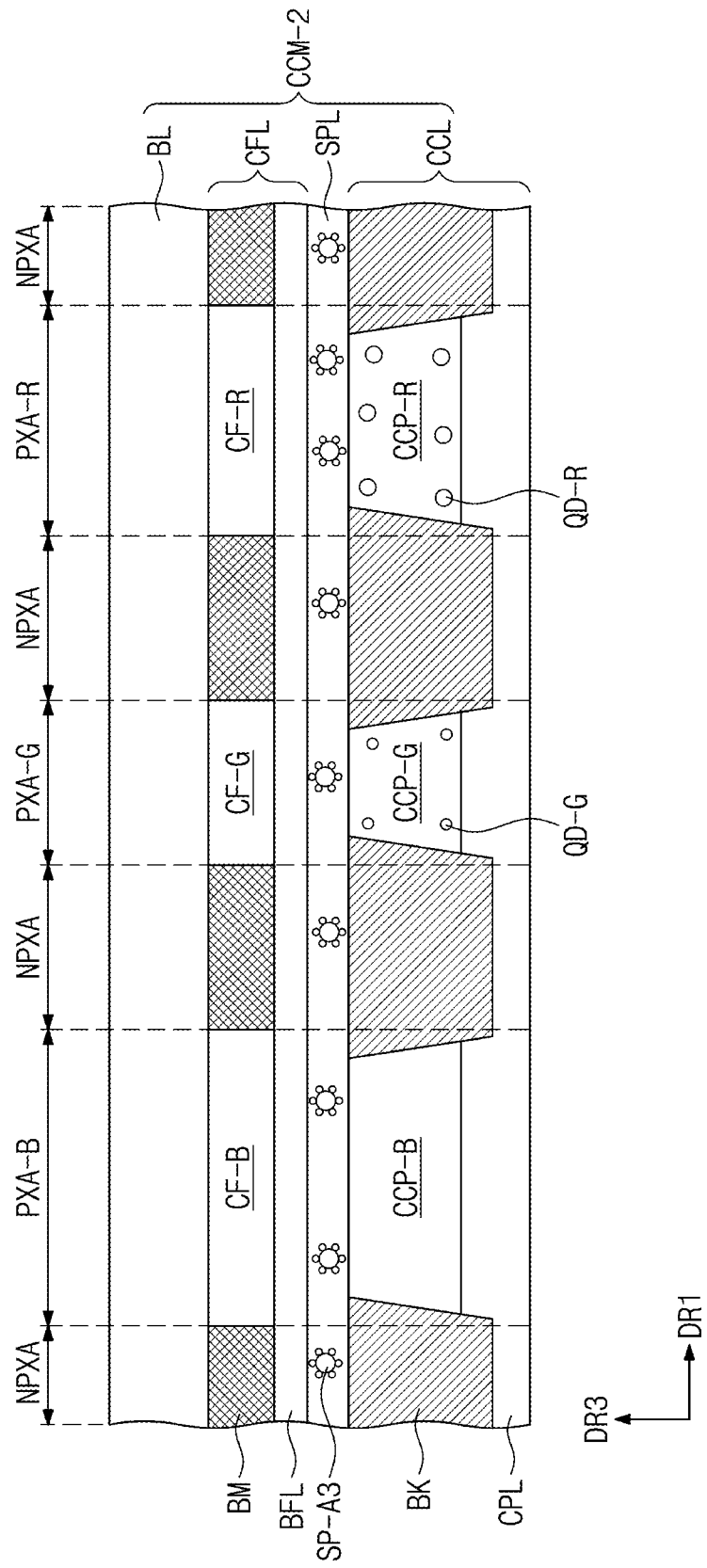
FIG. 9 is a sectional view illustrating a color control member according to an embodiment of the inventive concept.
Figure 10:
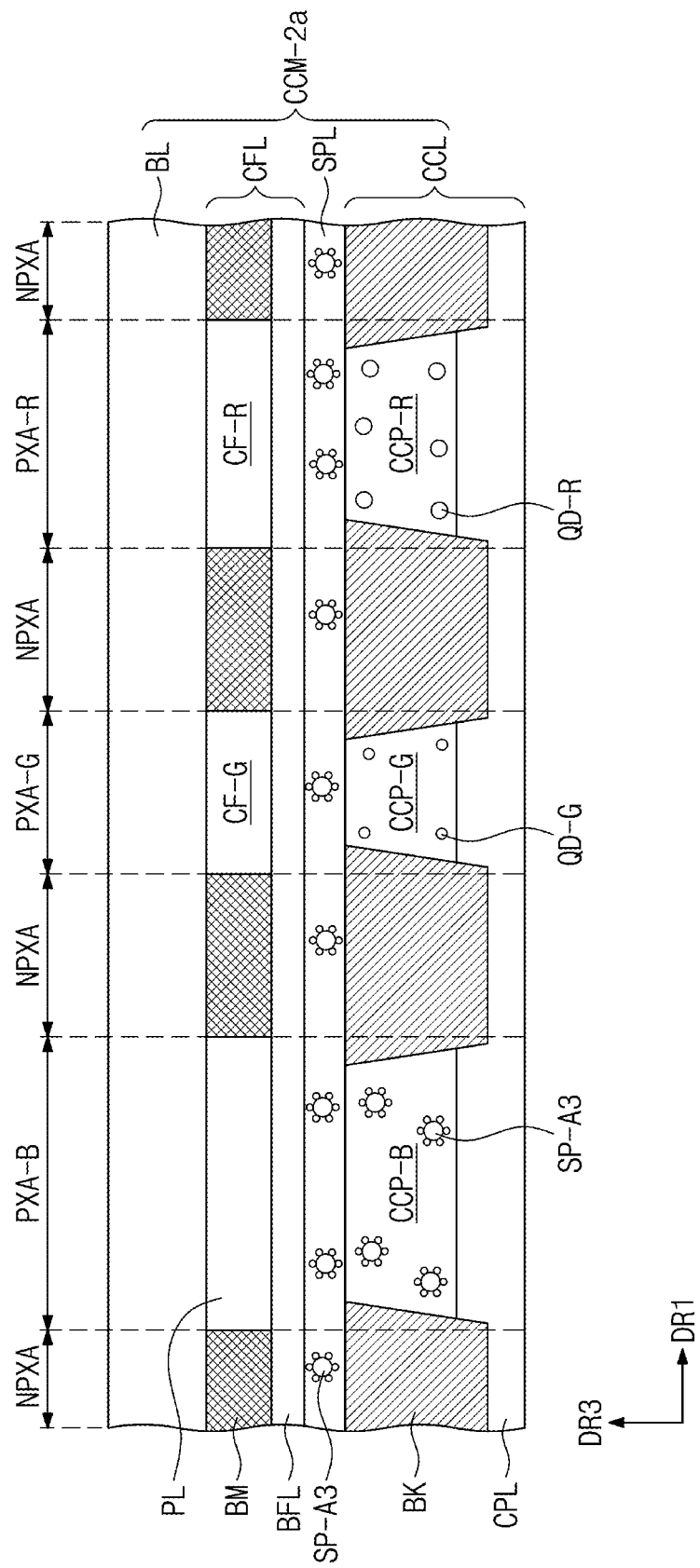
FIG. 10 is a sectional view illustrating a color control member according to an embodiment of the inventive concept.

FIGS. 9 and 10 are sectional views, each of which illustrates a color control member according to an embodiment of the inventive concept. Color control members CCM-2 and CCM-2a according to an embodiment of the inventive concept may include a scattering layer SPL including an absorptive scattering element SP-A3. Hereinafter, with regard to the color control member, which will be described with reference to FIGS. 9 and 10, an element described with reference to FIGS. 1 to 8 will be identified by the same reference number without repeating a redundant description thereof.

The scattering layer SPL may include the absorptive scattering element SP-A3. The absorptive scattering element SP-A3 may absorb light, whose peak wavelength ranges from 520 nm to 780 nm, in a high ratio. For example, the absorptive scattering element SP-A3 may be configured in such a way that transmittance of a green or red light is lower than transmittance of a blue light. Thus, the absorptive scattering element SP-A3 may absorb the green or red light in a high ratio and, in particular, may have optical absorptivity of 90% or higher to the green or red light. The absorptive scattering element SP-A3 may absorb an external light, which is within a wavelength range of the green or red light passing through the color filters CF-G and CF-R, in a high ratio, and this may make it possible to reduce the reflectance of the display apparatus to an external light.

Referring to FIG. 10, the absorptive scattering element SP-A3 may be included in the third color control unit CCP-B. The color filter layer CFL in the color control member CCM-2a may include the first color filter CF-G, the second color filter CF-R, and a protecting portion PL, which is disposed on the third color control unit CCP-B.

The protecting portion PL may be delimited from the color filters CF-G and CF-R adjacent thereto by the light-blocking portion BM. The protecting portion PL may transmit the first light, which is emitted from the light emitting device layer DP-OEL, and a visible light, which has a longer wavelength than the first light. The absorptive scattering element SP-A3 in the third color control unit CCP-B may absorb an external light, which is within a wavelength range of the green or red light passing through the protecting portion PL, in a high ratio. The color filter layer CFL may further include a buffer layer BFL disposed between the plurality of color filters CF-G, CF-R and the scattering layer SPL. The protecting portion PL may be formed of or include the same material as the buffer layer BFL. Thus, it may be possible to reduce a process time taken to dispose the third color filter CF-B.

The emitting elements QD-G and QD-R of FIGS. 4 to 10 may convert a first light, which is emitted from the light emitting device layer DP-OEL and has a peak wavelength of 500 nm or less, to light having a different peak wavelength from the first light. The first emitting element QD-G may convert the first light to a second light having a different wavelength from the first light. The second emitting element QD-R may convert the first light to a third light having a different wavelength from the first light. For example, the second light may be a green light, and the third light may be a red light.

The emitting elements QD-G and QD-R may be a fluorescent body. The fluorescent body serving as the emitting elements QD-G and QD-R may be an inorganic fluorescent body. The first emitting element QD-G may be a green fluorescent body and the second emitting element QD-R may be a red fluorescent body.

For example, the green fluorescent body may be at least one selected from the group consisting of $YBO_3:Ce^{3+}$, $Tb^{3+}$, $BaMgAl_{10}O_{17}:Eu^{2+}$, $Mn^{2+}$, $(Sr,Ca,Ba)(Al,Ga)_2S_4:Eu^{2+}$, $ZnS:Cu,Al$, $Ca_8Mg(SiO_4)_4Cl_2: Eu^{2+},Mn^{2+}$; $Ba_2SiO_4: Eu^{2+}$; $(Ba,Sr)_2SiO_4:Eu^{2+}$; $Ba_2(Mg, Zn)Si_2O_7:Eu^{2+}$; $(Ba,Sr)Al_2O_4: Eu^{2+}$, $Sr_2Si_3O_8 \cdot 2SrCl_2:Eu^{2+}$.

The red fluorescent body may be at least one selected from the group consisting of $(Sr,Ca,Ba,Mg)P_2O_7: Eu^{2+}$, $Mn^{2+}$, $CaLa_2S_4:Ce^{3+}$; $SrY_2S_4: Eu^{2+}$, $(Ca,Sr)S: Eu^{2+}$, $SrS:Eu$ $Eu^{2+}$, $Y_2O_3: Eu^{3+},Bi^{3+}$; $YVO4: Eu^{3+},Bi^{3+}$; $Y_2O_2S: Eu^{3+}$, $Bi^{3+}$; $Y_2O_2S: Eu^{3+}$.

The emitting elements QD-G and QD-R may be quantum dots. The quantum dot may be a particle converting a wavelength of light incident thereto. A core of the quantum dot may be formed of or include a material that is selected from the group consisting of II-VI compounds, III-VI compounds, III-V compounds, IV-VI compounds, group IV elements or compounds, compounds, or any combination thereof.

The II-VI compounds may be selected from the group consisting of binary compounds (e.g., including CdS, CdSe, CdTe, ZnS, ZnSe, ZnTe, ZnO, HgS, HgSe, HgTe, MgSe, and MgS), mixtures of the binary compounds, ternary compounds (e.g., including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS), mixtures of the ternary compounds, quaternary compounds (e.g., including CdZnSeS, CdZnSeTe, CdZnSTe, CdHgSeS, CdHgSeTe, CdHgSTe, HgZnSeS, HgZnSeTe, and HgZnSTe), and mixtures of the quaternary compounds.

The III-IV compounds may include bibary compounds (e.g., including $In_2S_3$ and $In_2Se_3$), ternary compounds (e.g., including $InGaS_3$ and $InGaSe_3$), or any combination thereof.

The III-V compounds may be selected from the group consisting of binary compounds (e.g., including GaN, GaP, GaAs, GaSb, AlN, AlP, AlAs, AlSb, InN, InP, InAs, and InSb), mixtures of the binary compounds, ternary compounds (e.g., including GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and GaAlNP), mixtures of the ternary compounds, quaternary compounds (e.g., including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb), and mixtures of the quaternary compounds.

Like InZnP, the III-V semiconductor compounds may further include the group II metal.

The IV-VI compounds may be selected from the group consisting of binary compounds (e.g., including SnS, SnSe, SnTe, PbS, PbSe, and PbTe), mixtures of the binary compounds, ternary compounds (e.g., including SnSeS, SnSeTe, SnSTe, PbSeS, PbSeTe, PbSTe, SnPbS, SnPbSe, and SnPbTe), mixtures of the ternary compounds, quaternary compounds (e.g., including SnPbSSe, SnPbSeTe, and SnPbSTe), and mixtures of the quaternary compounds. The group IV elements may be selected from the group consisting of Si, Ge, and mixtures thereof. The IV compounds may include binary compounds selected from the group consisting of SiC, SiGe, and mixtures thereof.

The I-III-VI semiconductor compounds may include ternary compounds (e.g., including AgInS, $AgInS_2$, CuInS, $CuInS_2$, $CuGaO_2$, $AgGaO_2$, and $AgAlO_2$) or any combination thereof.

Here, the binary, ternary, or quaternary compound may have a uniform concentration throughout the particle or may have a spatially varying concentration distribution in each particle.

The quantum dot may have a core-shell structure including a core and a shell surrounding the core. In an embodiment, the quantum dot may have a core-shell structure, in which a quantum dot is surrounded by another quantum dot. At an interface between the core and the shell, an element contained in the shell may have a concentration gradient decreasing in a central direction.

In certain embodiments, each of the quantum dots may have a core-shell structure, which includes a core containing the afore-described nanocrystal and a shell surrounding the core. The shell of the quantum dot may be used as a protection layer, which prevents chemical characteristics of the core from being changed and preserves the semiconductor property of the core, and/or may be used as a charging layer, which allows the quantum dot to have an electrophoresis property. The shell may be a single layer or a multiple layer. At an interface between the core and the shell, a concentration of element contained in the shell may have a concentration gradient decreasing in a central direction. For example, the shell of the quantum dot may be formed of or include oxide compounds of metallic or nonmetallic elements, semiconductor compounds, or any combination thereof.

For example, the oxide compounds of metallic or non-metallic elements for the shell may include binary compounds (e.g., $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO) and ternary compounds (e.g., $MgAl_2O_4$, $CoFe_2O_4$, $NiFe_2O_4$, and $CoMn_2O_4$), but the inventive concept is not limited to these examples.

In addition, the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, but the inventive concept is not limited to these examples.

Each of the quantum dots may have a light-emitting wavelength spectrum whose full width half maximum (FWHM) is less than about 45 nm (in particular, less than about 40 nm or in more particular, less than about 30 nm), and in this case, it may be possible to realize improved color purity or color reproduction characteristics. Furthermore, the quantum dots may emit light radially (i.e., in all directions), and thus, it may be possible to improve a viewing angle property.

In an embodiment, the quantum dots may be a spherical, pyramid-shaped, multi-arm, or cubic nano particle. In another embodiment, the quantum dots may be a nano tube, a nano wire, a nano fiber, a nano plate-shaped particle, but the inventive concept is not limited to these examples.

A wavelength or color of light emitted from the quantum dot may be determined by a particle size of the quantum dot, and thus, by providing quantum dots of various sizes, it may be possible to realize various colors (e.g., red and green). The smaller the particle size of the quantum dot, the shorter the wavelength of light emitted from the quantum dot. For example, a particle size of a quantum dot emitting a green light may be smaller than a particle size of a quantum dot emitting a red light.

The following Table 1 shows changes in efficiency and reflectance of the green and red color control units including the absorptive scattering element. In the embodiment shown in the Table 1, contents of the absorptive scattering element and the quantum dot in the green color control unit were 4.3 wt % and 51 wt %, respectively, relative to the total weight of the green color control unit, and contents of the absorptive scattering element and the quantum dot in the red color control unit were 4.0 wt % and 36 wt %, respectively, relative to the total weight of the red color control unit. In each color control unit, the remaining weight was a weight of a base resin.

The following Table 1 shows changes in efficiency, reflectance, and efficiency over equivalent reflectance, which are caused by the absorptive scattering element. The changes in efficiency and reflectance were obtained, based on the efficiency and reflectance which were set to 100% when $TiO_2$, a scattering element without a light absorbing portion, was included in a color control unit.

TABLE 1

| Items | Green color control unit | Red color control unit |
| --- | --- | --- |
| Content of quantum dot (wt %) | 51 | 36 |
| Content of absorptive scattering element (wt %) | 4.3 | 4.0 |
| Change in efficiency (%) | 84.9 | 75.3 |
| Change in reflectance (%) | 46.6 | 48.0 |
| Efficiency/Equivalent reflectance (%) | 125 | 109 |

Referring to Table 1, when efficiency and reflectance values in a comparative example were given as 100%, the efficiency values of the green and red color control units including the absorptive scattering element were reduced to 84.9% and 75.3%, respectively, but the reflectance values to the external light were reduced to 46.6% and 48.9%, respectively, by reduction amounts greater than the reduction in efficiency. Thus, for a color control unit including a scattering element without a light absorbing portion, the reflectance of the external light, instead of the efficiency, may be significantly increased. By contrast, for a color control unit including the absorptive scattering element with the light absorbing portion, there may be a reduction in the efficiency, but since the reduction in the reflectance of the external light is larger than the reduction in the efficiency, the total light-emitting efficiency may be increased.

The efficiencies over equivalent reflectances were obtained based on the efficiency equivalent reflectance, which were set to 100% when $TiO_2$, a scattering element without a light absorbing portion, was included in a color control unit. In order to compare the change in the total light-emitting efficiency caused by the reduction of the reflectance, in the efficiency over equivalent reflectances can be considered. Since the reflectance of an external light is reduced by the absorptive scattering element, the total light-emitting efficiency was increased to 125% in the green color control unit and to 109% in the red color control unit. From this result, it can be predicted that the total light-emitting efficiency of a panel, in which is not only the green and red color control units with the absorptive scattering element but also the blue color control unit with the dispersive scattering element are provided, will be increased to 110%.

The light-emitting efficiency of the display apparatus may be dependent on the optical conversion efficiency and the reflectance of the external light, and in embodiments, the efficiency and the reflectance of the external light may be reduced by the absorptive scattering element. However, since the reduction in the reflectance of the external light is greater than the reduction in the efficiency caused by the absorptive scattering element, the display apparatus according to an embodiment of the inventive concept may have an improved light-emitting efficiency.

Figure 11:
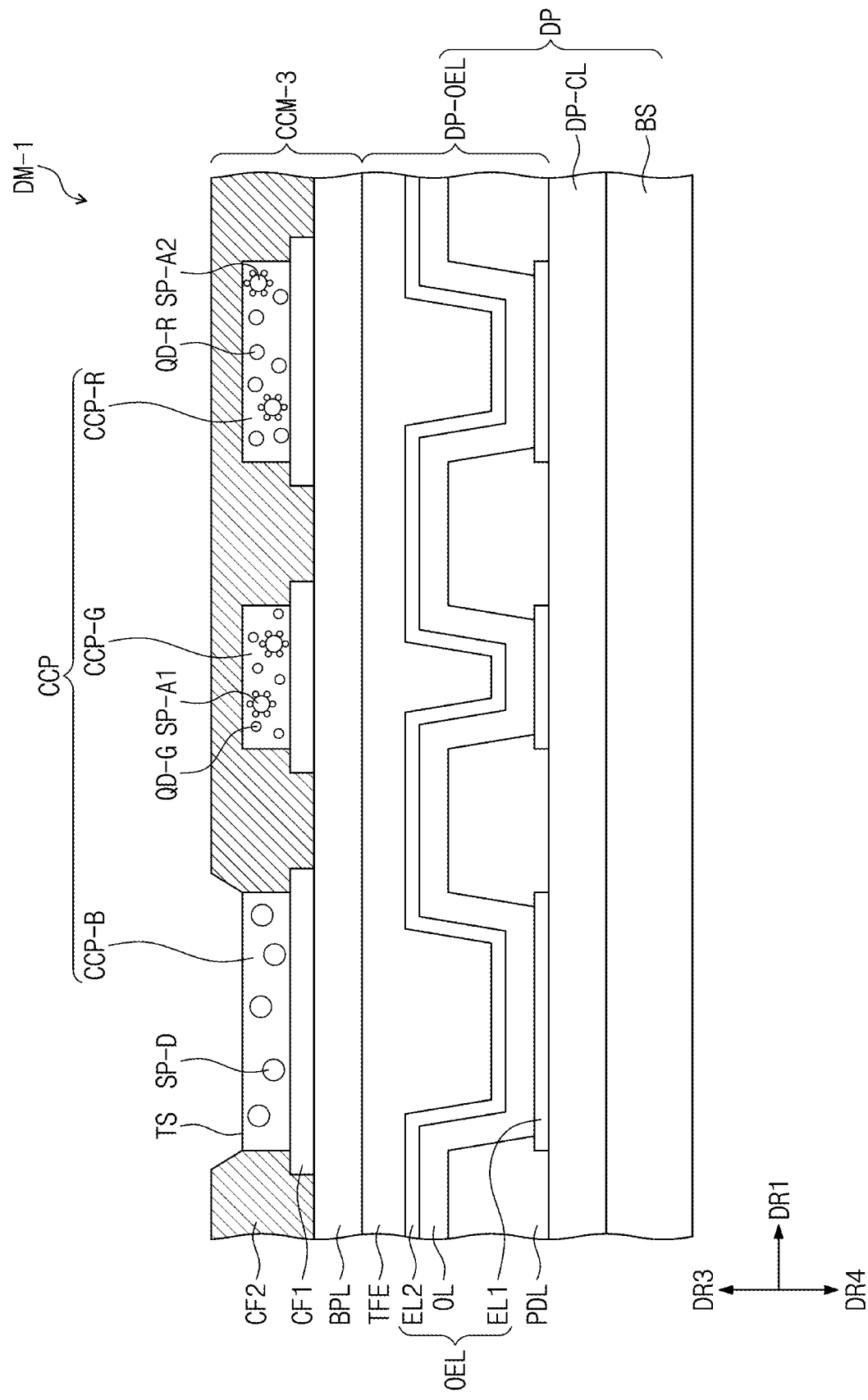
FIG. 11 is a sectional view illustrating a display apparatus according to an embodiment of the inventive concept.
Figure 12:
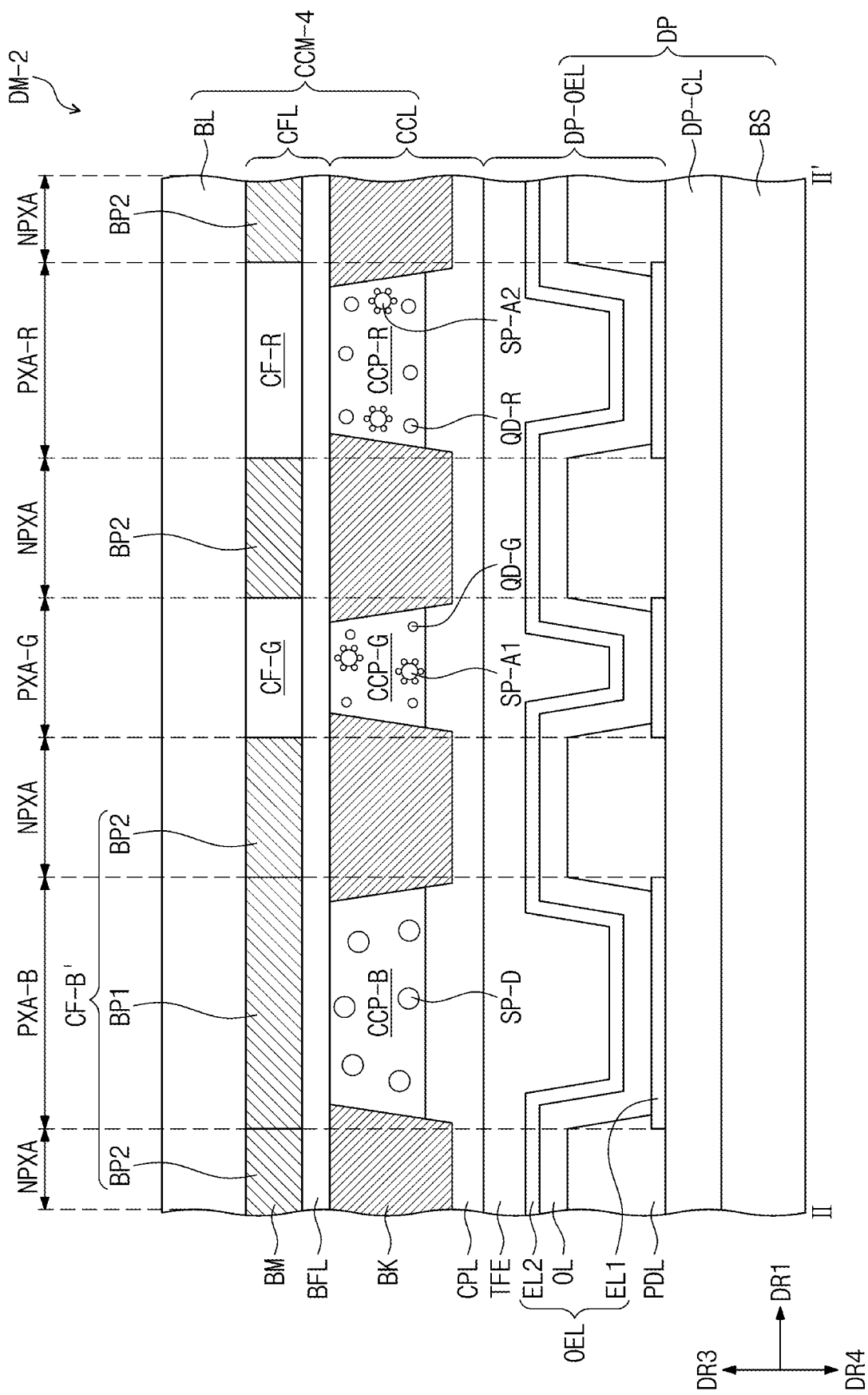
FIG. 12 is a sectional view illustrating a display apparatus according to an embodiment of the inventive concept.

FIGS. 11 and 12 are sectional views, each of which illustrates a display apparatus with an absorptive scattering element, according to an embodiment of the inventive concept. In the following description of display apparatuses DM-1 and DM-2 shown in FIGS. 11 and 12, an element described with reference to FIGS. 1 to 10 will be identified by the same reference number without repeating any redundant description thereof.

Referring to FIG. 11, a color control member CCM-3 of the display apparatus DM-1 may include a first color filter CF1, a color control unit CCP, and a second color filter CF2. The first color filter CF1, the color control unit CCP, and the second color filter CF2 may be sequentially stacked in the direction of the third direction axis DR3.

The color control member CCM-3 may include a plurality of first color filters CF1 disposed on the display panel DP to be spaced apart from each other along the first direction axis DR1. The first electrode EL1 of each of the organic electroluminescence device OEL in the light emitting device layer DP-OEL may be overlapped with a corresponding one of the first color filters CF1.

The first color filter CF1 may be configured to transmit light in a specific wavelength range. In detail, the first color filter CF1 may be configured to transmit the first light emitted from the light emitting device layer DP-OEL. For example, the first light may be a blue light. The first color filter CF1 may transmit the blue light, which is emitted from the light emitting device layer DP-OEL, but may absorb light within a wavelength range different from the blue light, and this may make it possible to increase the color purity of the blue light.

The color control member CCM-3 may include the color control units CCP-B, CCP-G, and CCP-R, and the absorptive scattering elements SP-A1 and SP-A2 may be included in at least one of the first and second color control units CCP-G and CCP-R. The third color control unit CCP-B may include the dispersive scattering element SP-D. Each of the first to third color control units CCP-B, CCP-G, and CCP-R may be disposed on the first color filter CF1.

The color control member CCM-3 may include the second color filter CF2. The second color filter CF2 may be overlapped with the first color control unit CCP-G and the second color control unit CCP-R, and the second color filter CF2 may expose a top surface TS of the third color control unit CCP-B. The blue light passing through the third color control unit CCP-B may not be absorbed by the second color filter CF2 and may be emitted to the outside of the display apparatus DM-1.

In an embodiment, the second color filter CF2 may transmit the green light and the red light and may block the blue light. The second color filter CF2 may be a yellow filter. The second color filter CF2 may absorb the blue light, which is the complementary color of the yellow color, and may prevent the transmission of the blue light. An external light, which is within a wavelength range of the green and red lights passing through the second color filter CF2, may be absorbed by the absorptive scattering elements SP-A1 and SP-A2, and thus, the reflectance of the external light may be reduced.

Referring to FIG. 12, a color control member CCM-4 of the display apparatus DM-2 may include first to third color filters CF-G, CF-R, and CF-B' and first to third color control units CCP-G, CCP-R, and CCP-B.

The color control member CCM-4 may include the color control units CCP-B, CCP-G, and CCP-R, and the absorptive scattering elements SP-A1 and SP-A2 may be included in at least one of the first and second color control units CCP-G and CCP-R. The third color control unit CCP-B may include the dispersive scattering element SP-D.

The third color filter CF-B' may include a filter part BP1 substantially serving as a color filter and a light-blocking part BP2 serving as a light-blocking pattern. In an embodiment, the filter part BP1 and the light-blocking part BP2 may be provided in the form of a single object.

In a display apparatus according to an embodiment of the inventive concept, an absorptive scattering element may be provided in a color control unit or a scattering layer with an absorptive scattering element may be disposed on the color control unit. A light absorbing portion in the absorptive scattering element may absorb a portion of an external light, which is provided from the outside of the display apparatus and is within a wavelength range of a green or red light, in a high ratio, and this may make it possible to reduce reflectance of the display apparatus to the external light.

According to an embodiment of the inventive concept, an absorptive scattering element may be provided to reduce reflectance of an external light.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art

What is claimed is:

1. A display apparatus, comprising:
   a light emitting device layer emitting a first light having a peak wavelength of 500 nm or less;
   a color control layer disposed on the light emitting device layer, the color control layer including an emitting element converting the first light;
   a color filter layer disposed on the color control layer; and
   an absorptive scattering element provided in or on the color control layer,
   wherein the absorptive scattering element comprises a light absorbing portion in which absorptivity to a green or red light is greater than absorptivity to the first light.

2. The display apparatus of claim 1, wherein the light absorbing portion has a mean transmittance of 70% or higher for light having a peak wavelength from 440 nm to 500 nm and has a mean transmittance of 10% or lower for light having a peak wavelength from 520 nm to 780 nm.

3. The display apparatus of claim 1, wherein the light absorbing portion comprises at least one of blue pigment or blue dye.

4. The display apparatus of claim 1, wherein the emitting element is a quantum dot or a fluorescent body.

5. The display apparatus of claim 1, wherein:
   the color control layer comprises a color control unit including the emitting element and the absorptive scattering element; and
   a weight ratio of the absorptive scattering element ranges from 1 wt % to 10 wt %, relative to a total weight of the color control unit.

6. The display apparatus of claim 1, wherein:
   the absorptive scattering element comprises a center portion with a scattering body; and
   the light absorbing portion is disposed on a surface of the center portion.

7. The display apparatus of claim 1, wherein:
   the color control layer comprises:
      a first color control unit including a first emitting element converting the first light to a second light, which has a different peak wavelength from that of the first light; and
      a second color control unit including a second emitting element converting the first light to a third light, which has a different peak wavelength from that of the first light; and
   the absorptive scattering element is provided in at least one of the first and second color control units.

8. The display apparatus of claim 7, wherein one of the first and second color control units comprises the absorptive scattering element, and the other comprises a dispersive scattering element including at least one of $TiO_2$, $ZrO_3$, $Al_2O_3$, MgO, $In_2O_3$, ZnO, $SnO_2$, $Sb_2O_3$, $SiO_2$, or ITO.

9. The display apparatus of claim 7, wherein:
   the color control layer further comprises a third color control unit configured to transmit the first light; and
   the third color control unit comprises a dispersive scattering element including at least one of $TiO_2$, $ZrO_3$, $Al_2O_3$, MgO, $In_2O_3$, ZnO, $SnO_2$, $Sb_2O_3$, $SiO_2$, or ITO.

10. The display apparatus of claim 9, wherein one of the first and second color control units comprises the absorptive scattering element, and the other comprises the dispersive scattering element.

11. The display apparatus of claim 1, further comprising a scattering layer disposed on the color control layer,
wherein the scattering layer comprises the absorptive scattering element.

12. The display apparatus of claim 11, wherein the scattering layer is disposed between the color control layer and the color filter layer.

13. The display apparatus of claim 11, wherein the color control layer comprises:
a first color control unit including a first emitting element converting the first light to a second light, which has a different peak wavelength from that of the first light;
a second color control unit including a second emitting element converting the first light to a third light, which has a different peak wavelength from that of the first light; and
a third color control unit configured to transmit the first light.

14. The display apparatus of claim 13, wherein the third color control unit further comprises the absorptive scattering element.

15. The display apparatus of claim 13, wherein the color filter layer comprises:
a first color filter disposed on the first color control unit and configured to transmit the second light;
a second color filter disposed on the second color control unit and configured to transmit the third light; and
a protecting portion disposed on the third color control unit and configured to transmit the first to third lights.

16. A display apparatus, comprising:
a light emitting device layer emitting a blue light;
a color control layer disposed on the light emitting device layer, the color control layer comprising an emitting element converting the blue light to a visible light, which has a wavelength longer than the blue light;
a color filter layer disposed on the color control layer; and
an absorptive scattering element provided in the color control layer or between the color control layer and the color filter layer,
wherein the absorptive scattering element comprises a scattering body and a light absorbing portion which includes blue pigment or blue dye disposed on a surface of the scattering body.

17. The display apparatus of claim 16, wherein the light absorbing portion has a mean transmittance of 70% or higher for light having a peak wavelength from 440 nm to 500 nm and has a mean transmittance of 10% or lower for light having a peak wavelength from 520 nm to 780 nm.

18. The display apparatus of claim 16, wherein the light absorbing portion comprises at least one of phthalocyanine blue ($C_{32}H_{16}CuN_8$) or cobalt blue ($CoAl_2O_4$).

19. The display apparatus of claim 16, wherein:
the color control layer comprises:
a first color control unit comprising a first emitting element converting the blue light to a green light;
a second color control unit comprising a second emitting element converting the blue light to a red light; and
a third color control unit including a dispersive scattering element; and
the color filter layer comprises:
a green color filter disposed on the first color control unit; and
a red color filter disposed on the second color control unit.

20. The display apparatus of claim 19, wherein:
the first or second color control unit comprises the absorptive scattering element; and
a weight ratio of the absorptive scattering element ranges from 1 wt % to 10 wt %, relative to a total weight of the first or second color control unit with the absorptive scattering element.

* * * * *